(12) United States Patent
Feng

(10) Patent No.: US 7,721,185 B1
(45) Date of Patent: May 18, 2010

(54) OPTIMIZED REED-SOLOMON DECODER

(75) Inventor: Weishi Feng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 450 days.

(21) Appl. No.: 11/327,934

(22) Filed: Jan. 9, 2006

Related U.S. Application Data

(63) Continuation of application No. 11/223,087, filed on Sep. 9, 2005.

(60) Provisional application No. 60/664,923, filed on Mar. 23, 2005.

(51) Int. Cl.
*H03M 13/00* (2006.01)

(52) U.S. Cl. .................................................. 714/784

(58) Field of Classification Search .................. 714/784
See application file for complete search history.

(56) References Cited

U.S. PATENT DOCUMENTS

| | | | | |
|---|---|---|---|---|
| 4,907,233 | A * | 3/1990 | Deutsch et al. | 714/755 |
| 5,392,299 | A * | 2/1995 | Rhines et al. | 714/756 |
| 5,430,739 | A | 7/1995 | Wei et al. | |
| 5,606,569 | A * | 2/1997 | MacDonald et al. | 714/758 |
| 5,659,557 | A * | 8/1997 | Glover et al. | 714/752 |
| 5,809,042 | A | 9/1998 | Nakamura et al. | |
| 5,996,103 | A * | 11/1999 | Jahanghir | 714/755 |
| 6,182,261 | B1 * | 1/2001 | Haller et al. | 714/758 |
| 6,332,206 | B1 | 12/2001 | Nakatsuji et al. | |
| 6,360,348 | B1 | 3/2002 | Yang | |
| 6,385,751 | B1 * | 5/2002 | Wolf | 714/784 |
| 6,449,746 | B1 | 9/2002 | Truong et al. | |
| 6,691,277 | B1 | 2/2004 | Golnabi et al. | |
| 7,221,680 | B2 * | 5/2007 | Vijayan et al. | 370/441 |
| 2007/0061688 | A1 | 3/2007 | Hassner et al. | |

OTHER PUBLICATIONS

MP0177; Efficient High-Speed Reed-Solomon Decoder, U.S. Appl. No. 10/305,091, filed Nov. 26, 2002.

MP0178; Error Evaluation For Inversionless Berlekamp-Massey Algorithm In Reed-Solomon Decoders; U.S. Appl. No. 10/292,181, filed Nov. 12, 2002.

(Continued)

*Primary Examiner*—Mujtaba K Chaudry
*Assistant Examiner*—Enam Ahmed

(57) ABSTRACT

An error decoding system that comprises a first Reed-Solomon (RS) decoder that receives an encoded codeword and generates a decoded codeword. An inner code (IC) decoder checks the decoded codeword for uncorrected errors. A decoding control module communicates with the first RS decoder and the IC decoder, iteratively modifies a parameter of the first RS decoder if the IC decoder detects uncorrected errors in the decoded codeword, and instructs the first RS decoder to decode the encoded codeword again after modifying the parameter.

26 Claims, 13 Drawing Sheets

OTHER PUBLICATIONS

The Euclidean Algorithm; 2 pages.
Integers 3, CID 1910, Joe Sawada, University of Guelph; 8 pages.
Reed-Solomon Codes and CD Encoding, Stan Hanley, Apr. 24, 2002; 6 pages.
Abstract algebra: Groups; Wikibooks; May 24, 2005; 13 pages.
Reed-Solomon Codes; May 23, 2005; H 263 Tutorial; 8 pages.
Reed-Solomon error correction; Wikipedia; May 27, 2005; 3 pages.
Discrete mathematics: Polynomials; Wikibooks; May 24, 2005; 5 pages.
Introduction to Finite Fields; May 25, 2005; 9 pages.
Integers; Excerpted from Beachy/Blair, Abstract Algebra, 2nd Ed., 1996; 28 pages.
Decoding Reed-Solomon Codes; Berlekamp's Iterative Algorithm for Finding the Error-Locator Polynomial; The Forney Algorithm for Computing the Error Magnitudes; Erasure Decoding; A. Matache; 1996; 7 pages.
Richard E. Blahut, Chapter 7 Theory and Practice of Error Control Code; 26 pages.
A Burst-Error-Correcting Algorithm for Reed-Solomon Codes; IEEE Transactions on Information Theory; vol. 38, No. 6, Nov. 1992, 6 pages.

* cited by examiner

OPTIMIZED REED-SOLOMON DECODER

CROSS-REFERENCE TO RELATED APPLICATIONS

This application is a continuation of U.S. patent application Ser. No. 11/223,087 filed on Sep. 9, 2005. This application claims the benefit of U.S. Provisional Application No. 60/664,923, filed on Mar. 23, 2005. The disclosures of the above applications are incorporated herein by reference.

FIELD OF THE INVENTION

The present invention relates to forward error correction (FEC), and more particularly to FEC using Reed-Solomon coding.

BACKGROUND OF THE INVENTION

Many communications systems perform forward error correction (FEC) to improve data transmission accuracy and ensure data integrity. FEC helps reduce bit error rates (BER) in applications such as data storage, digital video broadcasts, and wireless communications. Reed-Solomon (RS) error-correcting codes are commonly used for FEC.

Referring now to FIG. 1, a first device 10-1 communicates with a second device 10-2 over a communications channel 12. The communications channel 12 may be, for example, an Ethernet network, a wireless local area network, a bus for a hard drive, etc. The communications channel 12 may represent a storage media (such as a hard drive), in which case there would be no second device 10-2. Instead, the communications channel would store data from the first device 10-1 (e.g., the read/write head and channel of a hard drive) and later provide the data to the first device 10-1. Or, in the case of a compact disc, the first device 10-1 (the CD recording device) would not need a RS decoder 18-1 and the second device 10-2 (a CD player) would not need a RS decoder 18-2.

The first device 10-1 includes components 14-1 that output signals to a Reed-Solomon (RS) encoder 16-1 and that receive signals from a RS decoder 18-1. Likewise, the second device 10-2 includes components 14-2 that output signals to a RS encoder 16-2 and that receive signals from a RS decoder 18-2. The components 14-1 of the first device 10-1 may be similar to or different than the components 14-2 of the second device 10-2. The RS encoders 16 encode data before the encoded data is output onto the communications channel 12. The encoding process adds redundant information to the data stream that allows the RS decoders 18 to possibly detect and correct errors in the received data.

Reed-Solomon error correction is a block coding scheme. This means that data symbols are encoded as a group. A symbol is often represented as a group of bits (e.g., a ten-bit symbol). The code dimension, k, is the number of data symbols encoded together. After encoding, the resultant block (known as a codeword) contains a greater number, n, of symbols, where n is termed the block length. The (n−k) additional symbols, known as ECC check symbols, allow a Reed-Solomon decoder to detect and correct errors in a transmission. With (n−k) set equal to 2t, the Reed-Solomon code can correct up to t random errors. The code has a minimum Hamming distance $d_{min}=2t+1$, which means that Reed-Solomon codes are maximum distance separable (MDS). If $N_e$ is the number of random errors, a 2t Reed-Solomon code can correct all errors provided that $N_e \leq t$. These errors are random in that neither their location within the codeword nor their magnitude is known.

If the location of an error is known, the error is termed an erasure. Error locations may be identified when certain properties of the communications channel indicate that a particular symbol was not transmitted successfully. A standard Reed-Solomon code can correct up to 2t erasures. The ability to correct twice as many erasures as errors can be understood as follows: while both location and magnitude must be determined for each random error, half of such information is already known for an erasure. A combination of errors and erasures can be corrected if the following inequality holds: $N_a + 2N_e \leq 2t$, where $N_a$ is the number of erasures.

Alternately, a burst of errors can be corrected, provided that the total length of the burst is less than 2t. This burst of errors is not simply a set of erasures, because the location of the error burst within the codeword is unknown. All that is known is that the errors are contiguous. An algorithm to recover this burst of errors is described in J. Chen & P. Owsley, "A Burst-Error-Correction Algorithm for Reed-Solomon Codes," IEEE Trans. on Information Theory, Vol. 38, No. 6, November 1992. This algorithm fails, however, if the transmission contains one or more random errors that are not contiguous with the burst of errors.

For a mathematical foundation, Reed-Solomon codes operate over a finite field $GF(2^m)$. $GF(q)$ is a Galois field with q elements, and each of the q elements can be represented by m bits. If $n < 2^{m-1}$ and n is not a factor of $2^{m-1}$, shortened RS codes can be used. A codeword vector of length n over $GF(q)$ can be defined as $c=(c_0, c_1, \ldots, c_{n-1})$ where $n=q-1$. The codeword c can be represented as a polynomial $$c(x) = \sum_{i=0}^{n-1} c_i x^i.$$

Every codeword c is a multiple of a generator polynomial $g(x)$, where $$g(x)=(x-\alpha^{m_0})(x-\alpha^{m_0+1})\ldots(x-\alpha^{m_0+2t-1}).$$

The Fourier transform of the vector c is represented as $C=(C_0, C_1, \ldots, C_{n-1})$, where $$C_j = \sum_{i=0}^{n-1} c_i \alpha^{ij}, j = 0, 1, \ldots, n-1$$

and $\alpha$ is a primitive element of $GF(q)$. A t-error-correcting RS code is the collection of all vectors c with a Fourier transform satisfying $C_{m_0}=C_{m_0+1}=\ldots=C_{m_0+2t-1}=0$ for some integer $m_0$. The Fourier transform C of $c(x)$ has the same form as a polynomial evaluation of $c(x)$ at $x=\alpha^0, \alpha^1, \ldots, \alpha^{n-1}$. In other words, the Fourier transform coefficients are $C_j=c(\alpha^j)$. A t-error-correcting RS code can also be described as the collection of all vectors c such that $c(\alpha^{m_0})=c(\alpha^{m_0+1})=\ldots=c(\alpha^{m_030\ 2t-1})=0$.

An n-symbol codeword c from an RS encoder is transmitted over a communications channel, which may inject errors. A RS decoder receives an n-symbol vector v from the communications channel. The received vector, v, can be represented as $v=c+e$, where c is the transmitted codeword and $e=(e_0, e_1, \ldots, e_{n-1})$ is the error vector induced by the channel. Each element $e_i$ is nonzero only when there is an error at the ith position.

When v is received, the transmitted codeword c and the error vector e are not known. It is known, however, that the Fourier transform of c satisfies $C_{m_0} = \ldots = C_{m_0+2t-1} = 0$. Because the Fourier transform is a linear transformation, $$V_i = C_i + E_i \text{ for } i = 0, 1, \ldots, n-1,$$

where V and E are the Fourier transforms of the vectors v and e, respectively. Because codewords are defined such that $C_i = 0$ for $i = m_0, m_0+1, \ldots, m_0+2t-1$, it follows that:

$$E_i = V_i \text{ for } i = m_0, m_{0+1}, \ldots, m_0+2t-1.$$

$E_i$ can therefore be computed from the received vector for $i = m_0, \ldots, m_0+2t-1$. These $E_i$ are denoted as $S_i = E_{i+m_0}$ for $i = 0, \ldots, 2t-1$, and are called syndromes.

The RS decoder next computes the error vector e from the 2t syndromes, a task which can be divided into two parts. First, the error locations are found. In other words, the decoder finds all i such that $e_i \neq 0$. Second, the error values $e_i$ are determined for each of the error locations. Once e is known, the transmitted codeword c can be recovered by subtracting e from v. A fuller discussion of these steps is presented in R. E. Blahut, "Theory and Practice of Error Control Codes," Addison-Wesley 1983, which is hereby incorporated by reference in its entirety.

Referring now to FIG. 2, a flow chart presents steps performed by a Reed-Solomon decoder according to the prior art are shown generally at 20. Control begins in step 22 where the RS decoder computes the syndromes. In step 24 the RS decoder computes an error locator polynomial. The error locator polynomial can be computed using a variety of suitable algorithms, including the Berlekamp-Massey algorithm (BMA), inversionless BMA (iBMA), and the Euclidean algorithm. iBMA is disclosed in "Efficient High-Speed Reed-Solomon Decoder," U.S. patent application Ser. No. 10/305,091, filed Nov. 26, 2002, and "Error Evaluator For Inversionless Berlekamp-Massey Algorithm In Reed-Solomon Decoders," U.S. patent application Ser. No. 10/292,181, filed Nov. 12, 2002, which are hereby incorporated by reference in their entirety.

In step 26 the RS decoder calculates an error evaluator polynomial, often based on the syndromes and the error locator polynomial. This is traditionally given by $\Gamma(x) = S(x)\Lambda(x) \mod x^{2t}$, where $$S(x) = \sum_{i=0}^{2t-1} S_i x^i$$

is the syndrome polynomial. In step 28 the RS decoder determines error locations by finding the zeroes of the error locator polynomial. This can be accomplished by, for example, Chien's search algorithm, which is disclosed in R. T. Chien, "Cyclic Decoding Procedure for the Bose-Chandhuri-Hocquenghem Codes," I.E.E.E. Trans. on Information Theory, Vol. IT-10, pp. 357-63, October 1964, which is hereby incorporated by reference in its entirety. In step 30, the RS decoder calculates error values. Forney's algorithm is often used to find the error values, and is disclosed in G. D. Forney, "On Decoding BCH Codes," I.E.E.E. Trans. on Information Theory, Vol. IT-11, pp. 549-57, October 1965, which is hereby incorporated by reference in its entirety. The steps 20 may be arranged in a pipelined structure.

Referring now to FIG. 3, a Reed-Solomon decoder 32 typically includes a syndrome calculator 34 and an error locator polynomial generator 36. The RS decoder 32 also includes an error evaluator polynomial generator 38, an error location finder 40, and an error value finder 42. Control modules 44 and storage devices 46 may also be used to control decoding and to store data values for use by the RS decoder 32. As can be appreciated, some of the components of the RS decoder 32 may share multipliers and/or other elements to reduce cost.

The RS decoder computes the error locator polynomial, which is defined as a polynomial $$\Lambda(x) = \sum_{i=0}^{L} \Lambda_i x^i$$

satisfying the following conditions:

$$\Lambda(0) = 1; \Lambda(\alpha^{-i}) = 0 \text{ if and only if } e_i \neq 0.$$

Error locations are obtained by finding the zeros of $\Lambda(x)$. The Berlekamp-Massey Algorithm (BMA) iteratively computes the error locator polynomial $\Lambda(x)$. If the number of errors is less than or equal to t, the error locator polynomial is the polynomial of lowest degree that produces the syndrome sequence $S_0, S_1, \ldots, S_{2t-1}$. If the number of errors is greater than t, the BMA still generates the polynomial of lowest degree that produces the syndrome sequence. However, this polynomial is usually not a locator polynomial, and the decoding algorithm fails.

Referring now to FIG. 4, steps taken by an exemplary BMA implementation are depicted. The syndrome sequence $S_0, S_1, \ldots, S_{2t-1}$ and the number t are received as inputs. Control begins in step 100 where variables are initialized ($\Lambda(x) = 1$, $B(x) = 1$, $r = 0$, $L = 0$). In one embodiment, if erasure positions are known, $\Lambda(x)$ and $B(x)$ may be initialized to the erasure locator polynomial having zeroes at the known erasure locations. Further, L and r may be initialized to the number of erasures. In step 104, if r equals two times t, control transfers to step 108 and ends. Otherwise, control transfers to step 110 where the discrepancy $$\Delta = \sum_{i=0}^{L} \Lambda_i S_{r-i}$$

is computed.

If $\Delta \neq 0$ and $2L \leq r$ in step 112, control transfers to step 114; otherwise control transfers to step 116. In step 114 B(x) is set to $\Delta^{-1}\Lambda(x)$ and $\Lambda(x)$ is simultaneously set to $\Lambda(x) - \Delta x B(x)$. L is updated to $r+1-L$, and control continues with step 118. In step 116 B(x) is set to xB(x), $\Lambda(x)$ is simultaneously set to $\Lambda(x) - \Delta x B(x)$, and control continues with step 120. In step 118 r is set to r+1 and control returns to step 104.

SUMMARY OF THE INVENTION

A modified Reed-Solomon (RS) decoder comprises a syndrome calculation module that calculates a plurality of syndromes from a received codeword; a syndrome modification module that cyclically modifies the plurality of syndromes; an error correction module that selectively removes a set of error values from the received codeword at a set of error locations to create a corrected codeword; and a control module that determines whether the corrected codeword has a first state, generates a success signal when the corrected codeword has said first state, and selectively actuates the syndrome modification module when the corrected codeword has a second state.

In other features, the received codeword comprises a plurality of data symbols and a number C of check symbols, and the syndrome calculation module calculates C syndromes. The control module actuates the syndrome modification module when a further syndrome modification in the syndrome modification module yields a new error burst position, and generates a failure signal otherwise.

In still other features, the received codeword comprises n symbols, the modified RS decoder is capable of correcting a contiguous burst of corrupted symbols of length $L_B$, and the further syndrome modification does not yield a new error burst position when the syndrome modification module has been actuated n–$L_B$ times for the received codeword. An error shift module cyclically shifts each member of the set of error locations. The corrected codeword has said second state when the error shift module determines, after performing a shift, that one of the set of error locations is outside boundaries of the received codeword.

In further features, when the syndrome modification module has been actuated a first number of times, the error shift module cyclically shifts each member of the set of error locations by a second number of locations, where the second number is equal to the first number. The corrected codeword has said first state when no errors are detected in the corrected codeword. A cyclic redundancy check module is capable of detecting errors in the corrected codeword. An error value calculator module calculates the set of error values using Forney's algorithm. An error locator polynomial generation module generates an error locator polynomial using the plurality of syndromes.

In other features, the error locator polynomial generation module employs a pre-computed polynomial in generating the error locator polynomial. A plurality of pre-computed polynomials corresponds respectively to a plurality of values of a parameter, wherein the error locator polynomial generation module stores information for each of the plurality of pre-computed polynomials. The received codeword comprises a plurality of symbols, the modified RS decoder is capable of correcting a contiguous burst of corrupted symbols of length $L_B$, and the parameter is $L_B$.

In still other features, each of the pre-computed polynomials indicates a number of contiguous error locations, where the number is equal to a value of $L_B$ corresponding to the pre-computed polynomial. The error locator polynomial generation module initializes a working polynomial and a scratch polynomial to the pre-computed polynomial. An error location finding module implements a Chien search of roots of the error locator polynomial to determine the set of error locations. The error locator polynomial generation module generates the error locator polynomial from the plurality of syndromes without using a number x of the plurality of syndromes.

In further features, a discrepancy calculator calculates x discrepancy values from the x unused syndromes. The corrected codeword has said second state when if any of the x discrepancy values is nonzero.

A modified Reed-Solomon (RS) decoding method comprises calculating a plurality of syndromes from a received codeword; cyclically modifying the plurality of syndromes; selectively removing a set of error values from the received codeword at a set of error locations to create a corrected codeword; determining whether the corrected codeword has a first state; generating a success signal if the corrected codeword has said first state; and selectively repeating the cyclically modifying the plurality of syndromes when the corrected codeword has said second state.

In other features, the received codeword comprises a plurality of data symbols and a number C of check symbols, and the calculating the plurality of syndromes syndrome includes calculating C syndromes. The selectively repeating includes cyclically modifying the plurality of syndromes when a further syndrome modification yields a new error burst position, and generating a failure signal otherwise. The received codeword comprises n symbols, is capable of correcting a contiguous burst of corrupted symbols of length $L_B$, and the further syndrome modification does not yield a new error burst position when the selectively repeating has been performed n–$L_B$ times for the received codeword.

In still other features, each member of the set of error locations is cyclically shifted. The corrected codeword has said second state when, after the cyclically shifting, one of the set of error locations is outside boundaries of the received codeword. When the selectively repeating has been performed a first number of times, the cyclically shifting includes cyclically shifting each member of the set of error locations by a second number of locations, where the second number is equal to the first number. The corrected codeword has said first state when no errors are detected in the corrected codeword. A cyclic redundancy check is calculated to detect errors in the corrected codeword. The set of error values is calculated using Forney's algorithm.

In further features, an error locator polynomial is generated using the plurality of syndromes. The generating an error locator polynomial includes employing a pre-computed polynomial. Information for a plurality of pre-computed polynomials corresponding respectively to a plurality of values of a parameter is stored. The received codeword comprises a plurality of symbols, is capable of correcting a contiguous burst of corrupted symbols of length $L_B$, and the parameter is $L_B$.

In other features, each of the pre-computed polynomials indicates a number of contiguous error locations, where the number is equal to a value of $L_B$ corresponding to the pre-computed polynomial. The generating an error locator polynomial includes initializing a working polynomial and a scratch polynomial to the pre-computed polynomial. A Chien search of roots of the error locator polynomial is performed to determine the set of error locations.

The generating an error locator polynomial leaves a number x of the plurality of syndromes unused. In still other features, x discrepancy values are calculated from the x unused syndromes. The corrected codeword has said second state when any of the x discrepancy values is nonzero.

A computer program executed by a processor comprises a syndrome calculation module that calculates a plurality of syndromes from a received codeword; a syndrome modification module that cyclically modifies the plurality of syndromes; an error correction module that selectively removes a set of error values from the received codeword at a set of error locations to create a corrected codeword; and a control module that determines whether the corrected codeword has a first state, generates a success signal if the corrected codeword has said first state, and selectively actuates the syndrome modification module if the corrected codeword has a second state.

In other features, the received codeword comprises a plurality of data symbols and a number C of check symbols, and the syndrome calculation module calculates C syndromes. The control module actuates the syndrome modification module when a further syndrome modification in the syndrome modification module yields a new error burst position, and generates a failure signal otherwise. The received codeword comprises n symbols, is capable of correcting a contiguous burst of corrupted symbols of length $L_B$, and the further syndrome modification does not yield a new error burst position when the syndrome modification module has been actuated $n-L_B$ times for the received codeword.

In still other features, an error shift module cyclically shifts each member of the set of error locations. The corrected codeword has said second state when the error shift module determines, after performing a shift, that one of the set of error locations is outside boundaries of the received codeword. When the syndrome modification module has been actuated a first number of times, the error shift module cyclically shifts each member of the set of error locations by a second number of locations, where the second number is equal to the first number. The corrected codeword is determined valid if no errors are detected in the corrected codeword.

In further features, a cyclic redundancy check module is capable of detecting errors in the corrected codeword. An error value calculator module calculates the set of error values using Forney's algorithm. An error locator polynomial generation module generates an error locator polynomial using the plurality of syndromes. The error locator polynomial generation module employs a pre-computed polynomial in generating the error locator polynomial. A plurality of pre-computed polynomials corresponds respectively to a plurality of values of a parameter, wherein the error locator polynomial generation module stores information for each of the plurality of pre-computed polynomials.

In other features, the received codeword comprises a plurality of symbols, is capable of correcting a contiguous burst of corrupted symbols of length $L_B$, and the parameter is $L_B$. Each of the pre-computed polynomials indicates a number of contiguous error locations, where the number is equal to a value of $L_B$ corresponding to the pre-computed polynomial. The error locator polynomial generation module initializes a working polynomial and a scratch polynomial to the pre-computed polynomial. An error location finding module implements a Chien search of roots of the error locator polynomial to determine the set of error locations.

In still other features, the error locator polynomial generation module generates the error locator polynomial from the plurality of syndromes without using a number x of the plurality of syndromes. A discrepancy calculator calculates x discrepancy values from the x unused syndromes. The corrected codeword has said second state when any of the x discrepancy values is nonzero.

A modified Reed-Solomon (RS) decoder comprises syndrome calculation means for calculating a plurality of syndromes from a received codeword; syndrome modification means for cyclically modifying the plurality of syndromes; error correction means for selectively removing a set of error values from the received codeword at a set of error locations to create a corrected codeword; and control means for determining whether the corrected codeword has a first state, generating a success signal if the corrected codeword has said first state, and selectively actuating the syndrome modification means if the corrected codeword has a said second state.

In other features, the received codeword comprises a plurality of data symbols and a number C of check symbols, and the syndrome calculation means calculates C syndromes. The control means actuates the syndrome modification means when a further syndrome modification in the syndrome modification means yields a new error burst position, and generates a failure signal otherwise. The received codeword comprises n symbols, the modified RS decoder is capable of correcting a contiguous burst of corrupted symbols of length $L_B$, and the further syndrome modification does not yield a new error burst position when the syndrome modification means has been actuated $n-L_B$ times for the received codeword.

In still other features, error shift means cyclically shifts each member of the set of error locations. The corrected codeword has said second state when the error shift means determines, after performing a shift, that one of the set of error locations is outside boundaries of the received codeword. When the syndrome modification means has been actuated a first number of times, the error shift means cyclically shifts each member of the set of error locations by a second number of locations, where the second number is equal to the first number.

In further features, the corrected codeword has said first state when no errors are detected in the corrected codeword. Cyclic redundancy check means detects errors in the corrected codeword. Error value calculating means calculates the set of error values using Forney's algorithm. Error locator polynomial generation means generates an error locator polynomial using the plurality of syndromes. The error locator polynomial generation means employs a pre-computed polynomial in generating the error locator polynomial.

In other features, a plurality of pre-computed polynomials corresponds respectively to a plurality of values of a parameter, wherein the error locator polynomial generation means stores information for each of the plurality of pre-computed polynomials. The received codeword comprises a plurality of symbols, the modified RS decoder is capable of correcting a contiguous burst of corrupted symbols of length $L_B$, and the parameter is $L_B$.

In further features, each of the pre-computed polynomials indicates a number of contiguous error locations, where the number is equal to a value of $L_B$ corresponding to the pre-computed polynomial. The error locator polynomial generation means initializes a working polynomial and a scratch polynomial to the pre-computed polynomial. Error location finding means implements a Chien search of roots of the error locator polynomial to determine the set of error locations.

In other features, the error locator polynomial generation means generates the error locator polynomial from the plurality of syndromes without using a number x of the plurality of syndromes. Discrepancy calculating means calculates x discrepancy values from the x unused syndromes. The corrected codeword has said second state when any of the x discrepancy values is nonzero.

An error decoding system comprises a first Reed-Solomon (RS) decoder that receives an encoded codeword and generates a decoded codeword; an inner code (IC) decoder that checks the decoded codeword for uncorrected errors; and a decoding control module that communicates with the first RS decoder and the IC decoder, that iteratively modifies a parameter of the first RS decoder if the IC decoder detects uncorrected errors in the decoded codeword, and that instructs the first RS decoder to decode the encoded codeword again after modifying the parameter.

In other features, the IC decoder includes at least one of a cyclic redundancy check module and a checksum computation module. The encoded codeword comprises a plurality of symbols and the first RS decoder is capable of correcting a contiguous burst of corrupted symbols of length n. The encoded codeword comprises a plurality of data symbols and a number C of check symbols, and the first RS decoder is capable of correcting x random errors and a contiguous burst of corrupted symbols of length n when $2x+n<C$.

In still other features, the decoding control module varies the parameter over a range of values. The decoding control module varies the parameter by multiples of two. The decoding control module repeatedly instructs the first RS decoder to decode the encoded codeword until the occurrence of at least one of the following: the IC decoder detects no uncorrected errors in the decoded codeword and the decoding control module reaches an end of the range of values.

In further features, the parameter modified by the decoding control module includes the error burst length, and wherein the decoding control module varies the error burst length from a first value through a second value until the IC decoder detects no uncorrected errors. The first value is greater than the second value. The encoded codeword comprises a plurality of data symbols and a number C of check symbols, and wherein the first value is less than or equal to C−3. The second value is greater than or equal to 3.

In other features, a second Reed-Solomon (RS) decoder generates a second decoded codeword from the encoded codeword, wherein if the IC decoder detects no uncorrected errors in the second decoded codeword, the decoding control module instructs the first RS decoder to remain idle. The encoded codeword comprises a plurality of data symbols and 2t check symbols, and the second RS decoder is capable of correcting up to x errors and y erasures when $2x+y \leq 2t$. The second RS decoder includes the first RS decoder operating in a specific operating mode.

An error-resistant communications system comprises the error decoding system; an encoding system including an inner code (IC) encoder and a Reed-Solomon (RS) encoder, wherein the IC encoder receives user data, encodes the user data with error checking information into a first codeword, and transmits the first codeword to the RS encoder, and wherein the RS encoder generates an encoded codeword from the first codeword; and a communications channel that receives the encoded codeword, selectively introduces errors into the encoded codeword, and transmits the encoded codeword to the error decoding system.

In other features, the IC encoder appends a calculated value to the user data to form the first codeword. The IC decoder calculates a second value from the decoded codeword, and determines that the decoded codeword contains uncorrected errors if the second value is not equal to the appended calculated value.

An error decoding method comprises receiving an encoded codeword; generating a decoded codeword using Reed-Solomon (RS) decoding; checking the decoded codeword for uncorrected errors; iteratively modifying a parameter of the RS decoding if uncorrected errors are detected in the decoded codeword; and repeating the generating the decoded codeword.

In other features, the checking the decoded codeword includes calculating at least one of a cyclic redundancy check and a checksum. The generating the decoded codeword includes correcting a contiguous burst of corrupted symbols of length n. The encoded codeword comprises a plurality of data symbols and a number C of check symbols, and wherein the generating the decoded codeword includes correcting x random errors and a contiguous burst of corrupted symbols of length n when $2x+n<C$.

In still other features, the iteratively modifying the parameter includes varying the parameter over a range of values. The iteratively modifying the parameter includes varying the parameter by multiples of two. The repeating the generating the decoded codeword includes repeating until the occurrence of at least one of the following: no uncorrected errors are detected in the decoded codeword and an end of the range of values is reached.

In further features, the iteratively modifying the parameter includes varying the error burst length from a first value through a second value until no uncorrected errors are detected, and wherein the parameter modified by the decoding control module includes the error burst length. The first value is greater than the second value. The encoded codeword comprises a plurality of data symbols and a number C of check symbols, and wherein the first value is less than or equal to C−3. The second value is greater than or equal to 3.

An error-resistant communications method comprises the error decoding method; receiving user data; encoding the user data with error checking information into a first codeword; generating an encoded codeword from a first codeword; transmitting the encoded codeword through a communications channel that selectively introduces errors into the encoded codeword; and providing the encoded codeword to the error decoding method.

In other features, the encoding the user data includes appending a calculated value to the user data. The checking the decoded codeword includes calculating a second value from the decoded codeword, and determining that the decoded codeword contains uncorrected errors if the second value is not equal to the appended calculated value.

A computer program executed by a processor comprises a first Reed-Solomon (RS) decoder that receives an encoded codeword and generates a decoded codeword; an inner code (IC) decoder that checks the decoded codeword for uncorrected errors; and a decoding control module that communicates with the first RS decoder and the IC decoder, that iteratively modifies a parameter of the first RS decoder if the IC decoder detects uncorrected errors in the decoded codeword, and that instructs the first RS decoder to decode the encoded codeword again after modifying the parameter.

In other features, the IC decoder includes at least one of a cyclic redundancy check module and a checksum computation module. The encoded codeword comprises a plurality of symbols and the first RS decoder is capable of correcting a contiguous burst of corrupted symbols of length n. The encoded codeword comprises a plurality of data symbols and a number C of check symbols, and the first RS decoder is capable of correcting x random errors and a contiguous burst of corrupted symbols of length n when $2x+n<C$.

In still other features, the decoding control module varies the parameter over a range of values. The decoding control module varies the parameter by multiples of two. The decoding control module repeatedly instructs the first RS decoder to decode the encoded codeword until the occurrence of at least one of the following: the IC decoder detects no uncorrected errors in the decoded codeword and the decoding control module reaches an end of the range of values.

In further features, the parameter modified by the decoding control module includes the error burst length, and wherein the decoding control module varies the error burst length from a first value through a second value until the IC decoder detects no uncorrected errors. The first value is greater than the second value. The encoded codeword comprises a plurality of data symbols and a number C of check symbols, and wherein the first value is less than or equal to C−3. The second value is greater than or equal to 3.

In other features, a second Reed-Solomon (RS) decoder generates a second decoded codeword from the encoded codeword, wherein if the IC decoder detects no uncorrected errors in the second decoded codeword, the decoding control module instructs the first RS decoder to remain idle. The encoded codeword comprises a plurality of data symbols and 2t check symbols, and the second RS decoder is capable of correcting up to x errors and y erasures when $2x+y \leq 2t$. The second RS decoder includes the first RS decoder operating in a specific operating mode.

An error-resistant communications system comprises the computer program; a second computer program executed by a processor comprises an encoding system including an inner code (IC) encoder and a Reed-Solomon (RS) encoder, wherein the IC encoder receives user data, encodes the user data with error checking information into a first codeword, and transmits the first codeword to the RS encoder, and wherein the RS encoder generates an encoded codeword from the first codeword; and a communications channel that receives the encoded codeword, selectively introduces errors into the encoded codeword, and transmits the encoded codeword to the computer program.

In other features, the IC encoder appends a calculated value to the user data to form the first codeword. The IC decoder calculates a second value from the decoded codeword, and determines that the decoded codeword contains uncorrected errors if the second value is not equal to the appended calculated value.

An error decoding system comprises first Reed-Solomon (RS) decoding means for receiving an encoded codeword and generating a decoded codeword; inner code (IC) decoding means for checking the decoded codeword for uncorrected errors; and decoding control means for communicating with the first RS decoder and the IC decoder, for iteratively modifying a parameter of the first RS decoder if the IC decoder detects uncorrected errors in the decoded codeword, and for instructing the first RS decoder to decode the encoded codeword again after modifying the parameter.

In other features, the IC decoding means includes at least one of cyclic redundancy checking means and checksum computation means. The encoded codeword comprises a plurality of symbols and the first RS decoding means is capable of correcting a contiguous burst of corrupted symbols of length n. The encoded codeword comprises a plurality of data symbols and a number C of check symbols, and the first RS decoding means is capable of correcting x random errors and a contiguous burst of corrupted symbols of length n when $2x+n<C$.

In still other features, the decoding control means varies the parameter over a range of values. The decoding control means varies the parameter by multiples of two. The decoding control means repeatedly instructs the first RS decoding means to decode the encoded codeword until the occurrence of at least one of the following: the IC decoding means detects no uncorrected errors in the decoded codeword and the decoding control means reaches an end of the range of values.

In further features, the parameter modified by the decoding control means includes the error burst length, and wherein the decoding control means varies the error burst length from a first value through a second value until the IC decoding means detects no uncorrected errors. The first value is greater than the second value. The encoded codeword comprises a plurality of data symbols and a number C of check symbols, and wherein the first value is less than or equal to C−3. The second value is greater than or equal to 3.

In other features, second Reed-Solomon (RS) decoding means generates a second decoded codeword from the encoded codeword, wherein if the IC decoding means detects no uncorrected errors in the second decoded codeword, the decoding control means instructs the first RS decoding means to remain idle. The encoded codeword comprises a plurality of data symbols and 2t check symbols, and the second RS decoding means is capable of correcting up to x errors and y erasures when $2x+y \leq 2t$. The second RS decoding means includes the first RS decoding means operating in a specific operating mode.

An error-resistant communications system comprises the error decoding system; an encoding system including inner code (IC) encoding means and Reed-Solomon (RS) encoding means, wherein the IC encoding means is for receiving user data, encoding the user data with error checking information into a first codeword, and transmitting the first codeword to the RS encoding means, and wherein the RS encoding means is for generating an encoded codeword from the first codeword; and communications channel means for receiving the encoded codeword, selectively introducing errors into the encoded codeword, and transmitting the encoded codeword to the error decoding system.

In other features, the IC encoding means appends a calculated value to the user data to form the first codeword. The IC decoding means calculates a second value from the decoded codeword, and determines that the decoded codeword contains uncorrected errors if the second value is not equal to the appended calculated value.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
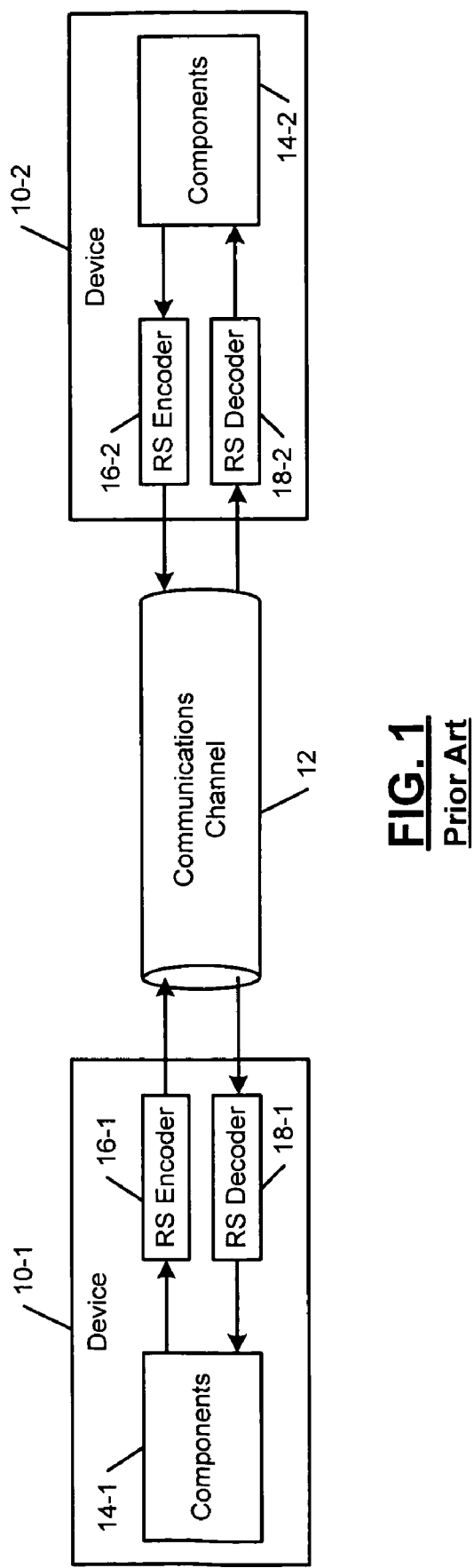
FIG. 1 is a functional block diagram of first and second devices that include RS encoders/decoders according to the prior art.
Figure 3:
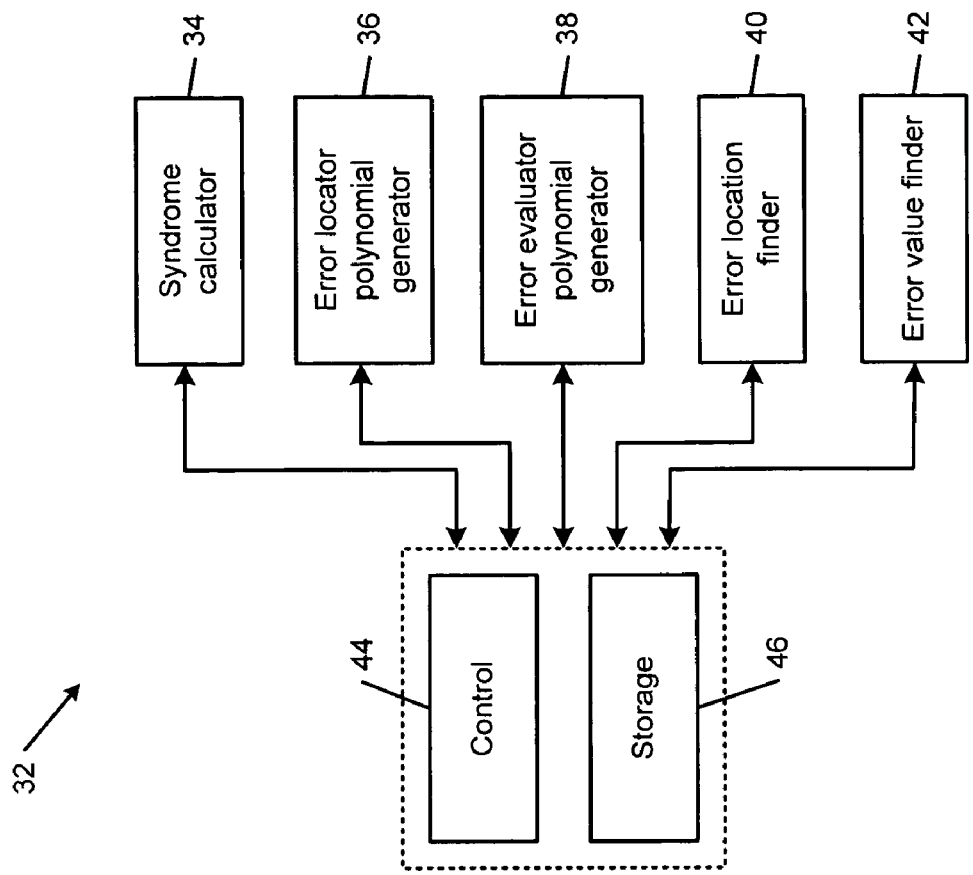
FIG. 3 is a functional block diagram of a RS decoder according to the prior art.
Figure 2:
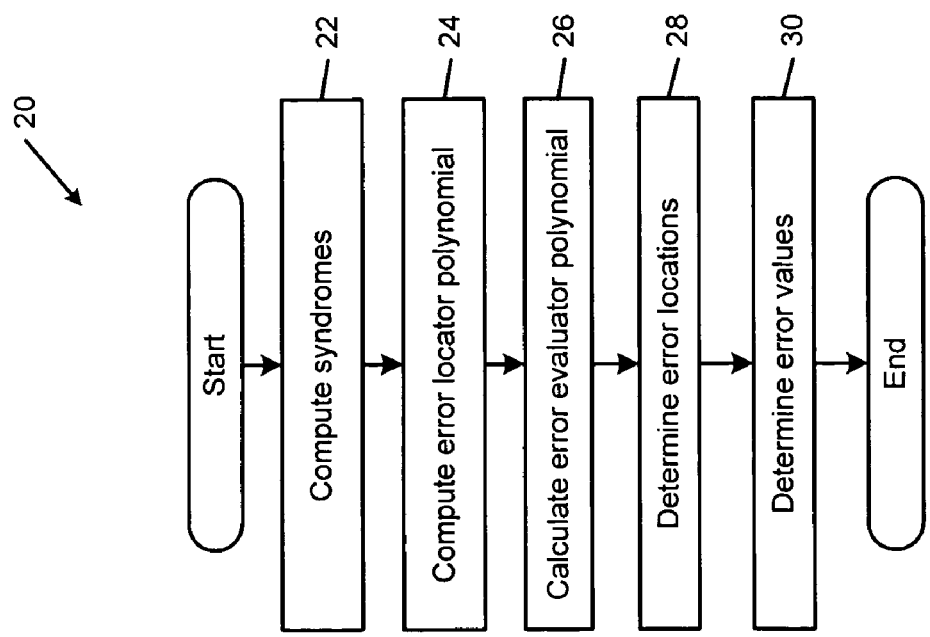
FIG. 2 is a flow chart presenting exemplary steps for Reed-Solomon (RS) decoding according to the prior art.

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive or. It should be understood that steps within a method may be executed in different order without altering the principles of the present invention.

Many communications systems, including hard disk drives, experience burst errors. A common failure scenario for a hard drive sector is to produce a long burst of errors plus a few random errors. An algorithm presented herein will allow a Reed-Solomon decoder to correct such a transmission, provided that $L_B+2N_e \leq 2t-1$, where $L_B$ is the maximum length of the error burst, $N_e$ is the number of random errors, and 2t is the number of symbols added by the encoder (n−k). Note that the location of the error burst is unknown (were it known, the error burst would actually be a string of erasures); only the fact that there are a string of adjacent errors somewhere within the codeword is known (or assumed on a trial basis).

Figure 5:
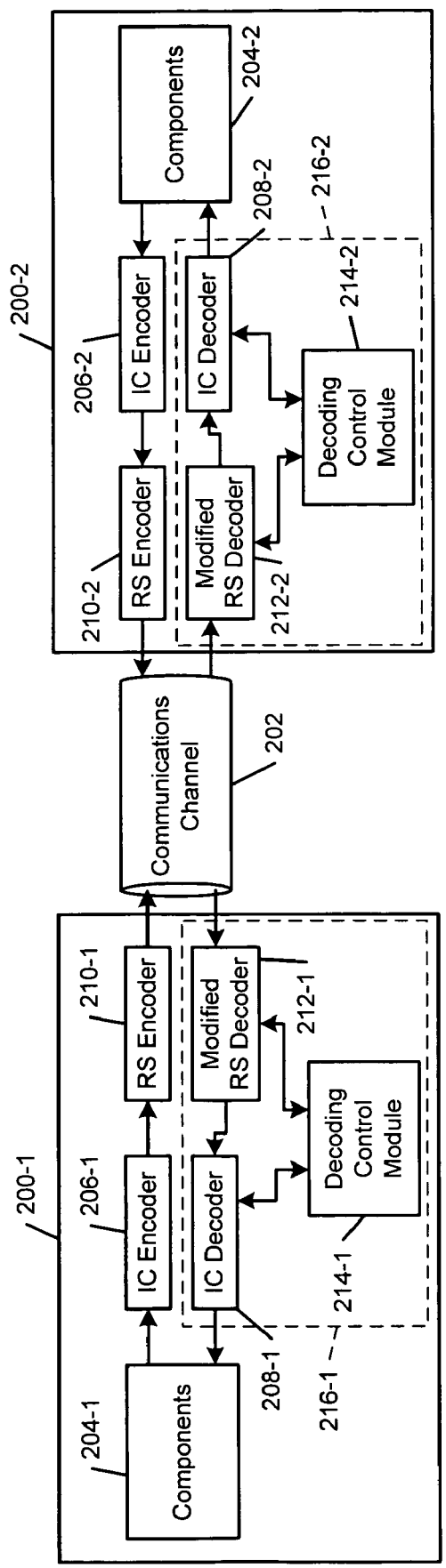
FIG. 5 is a functional block diagram of an exemplary transmission system according to the principles of the present invention.

Referring now to FIG. 5, a functional block diagram of an exemplary transmission system according to the principles of the present invention is presented. A first device 200-1 communicates with a second device 200-2 over a communications channel 202. The first device 200-1 includes components 204-1, which output signals to an inner code (IC) encoder 206-1 and receive signals from an IC decoder 208-1. The inner code may be a CRC (cyclic redundancy check), a checksum, or any other suitable error detecting scheme. A CRC encoder, for example, calculates a value from a set of received data and appends the value to the set of received data. A CRC decoder would then calculate such a value again, and verify that it matches the stored value.

The IC encoder 206-1 communicates encoded data to a Reed-Solomon (RS) encoder 210-1, which encodes the data a second time and communicates encoded data to the communications channel 202. A modified RS decoder 212-1 receives encoded signals from the communication channel 202, decodes the RS encoding, and passes the resulting signals to the IC decoder 208-1. A decoding control module 214-1 communicates with the IC decoder 208-1 and the modified RS decoder 212-1, together comprising a modified decoder system 216-1.

Likewise, the second device 200-2 includes components 204-2 that output signals to an IC decoder 206-2 and that receive signals from an IC decoder 208-2. The IC encoder 206-2 passes signals to an RS encoder 210-2, which in turn passes signals to the communications channel 202. A modified RS decoder 212-2 receives signals from the communications channel 202 and communicates signals to an IC decoder 208-2. A decoding control module 214-2 communicates with the modified RS decoder 212-2 and the IC decoder 208-2, together comprising a modified decoding system 216-2.

The communications channel may introduce errors into the transmitted data stream. In this exemplary implementation, the IC encoders 206 add information to the incoming data steam to allow the IC decoders 208 to determine whether any errors were not uncorrected by the modified RS decoders 212. The decoding control modules 214 may alter parameters of the modified RS decoders 212 until the IC decoders 208 no longer detect uncorrected errors. If no set of parameters allows the modified RS decoders 212 to correct all errors, the decoding control modules 214 signal that uncorrectable errors have occurred.

Figure 6:
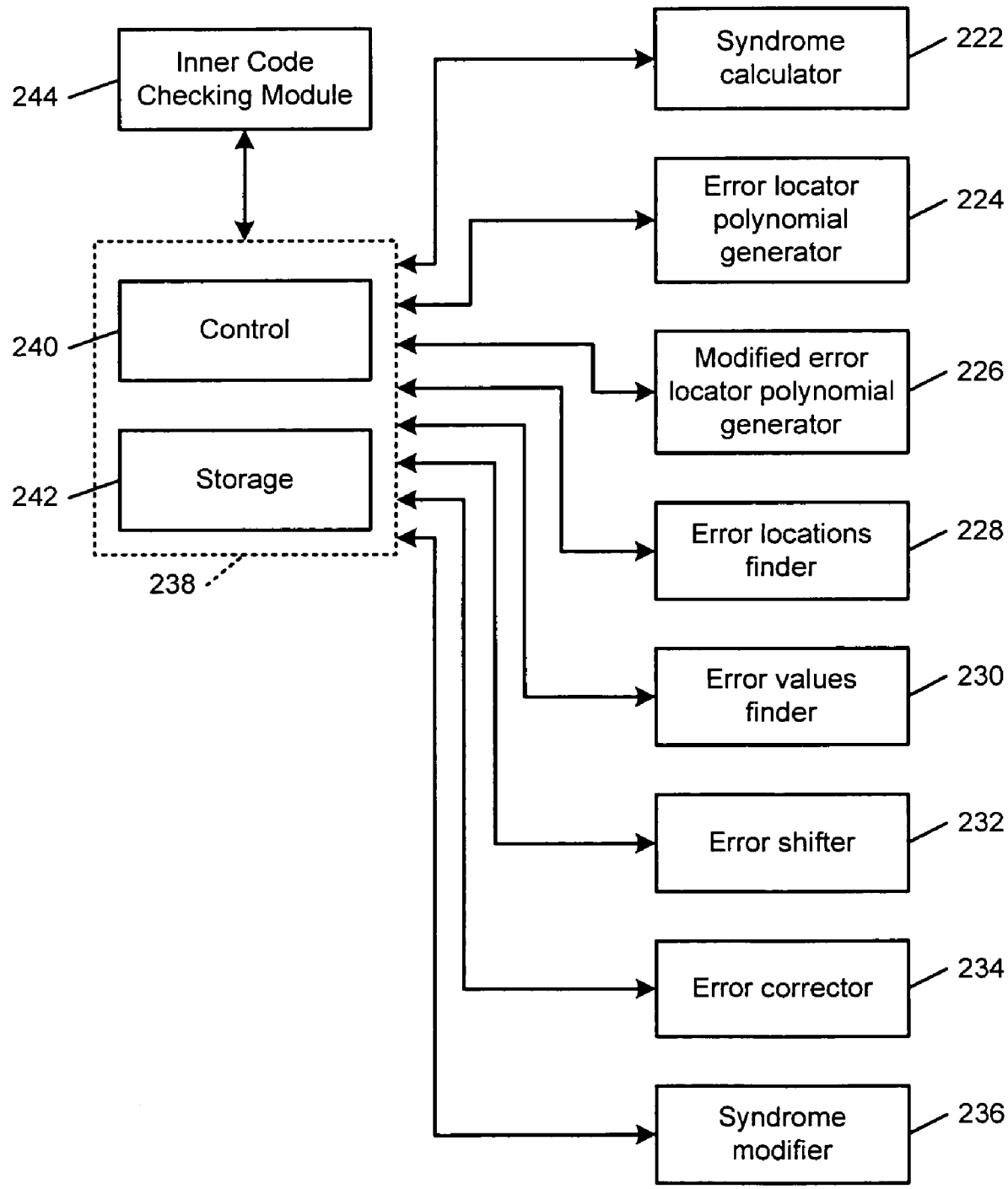
FIG. 6 is a functional block diagram of an exemplary implementation of a modified RS decoder according to the principles of the present invention.

Referring now to FIG. 6, a functional block diagram of an exemplary implementation of a modified Reed-Solomon decoder 220 according to the principles of the present invention is presented. The RS decoder includes a syndrome calculator 222, an error locator polynomial generator 224, a modified error locator polynomial generator 226, an error locations finder 228, an error values finder 230, an error shifter 232, an error corrector 234, and a syndrome modifier 236, which all communicate with a control module 238. The control module 238 includes control elements 240 and storage elements 242, used to process and store data values for use by the RS decoder 220. The control module 238 also communicates with an inner code checking module 224. As can be appreciated, some of the components of the modified RS decoder 220 may share multipliers and/or other elements to reduce cost.

Figure 7:
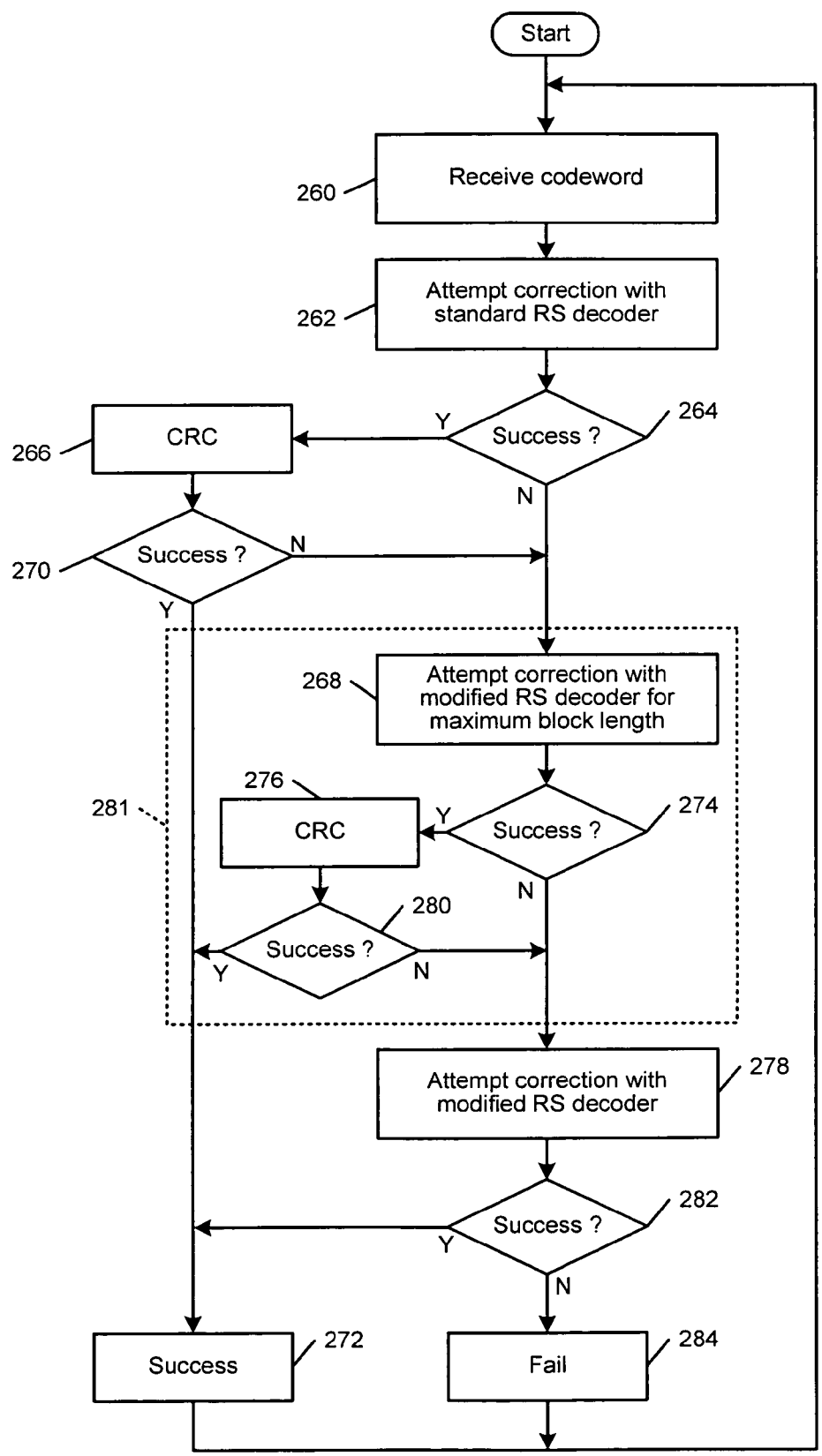
FIG. 7 is a flow chart depicting exemplary steps taken by a decoding control module according to the principles of the present invention.

Referring now to FIG. 7, a flow chart depicting exemplary steps taken by a decoding control module according to the principles of the present invention is presented. Control starts in step 260 where a codeword is received. Control continues in step 262 where error correction is attempted using a standard Reed-Solomon decoder. Control continues in step 264 where if a standard Reed-Solomon decoder was successful in decoding errors, control transfers to step 266; otherwise control transfers to step 268.

In step 266 an inner code check such as a cyclic redundancy check (CRC) is performed. Control continues in step 270 where if the inner code check is successful, control transfers to step 272; otherwise control transfers to step 268. In step 272 success is signaled because the probability that any errors miscorrected by the RS decoder not being caught by the inner code is extremely low. In step 268 error correction of the original received codeword is attempted for a maximum length block of errors. This can be accomplished in a variety of ways, including the algorithm disclosed by Chen and Owsley, "A Burst-Error-Correction Algorithm For Reed-Solomon Codes." Alternately, correction may be attempted by using the modified Reed-Solomon decoder of the present invention with $L_B$ set to 2t, as described in FIG. 15.

Control continues in step 274 where if the maximum error length correction was deemed successful, control transfers to step 276; otherwise control transfers to step 278. In step 276 an inner code such as a CRC check is performed. This step may be skipped if the maximum error length detection scheme already performed such a check. Control continues in step 280 where if the inner code check is successful, control transfers to step 272; otherwise control transfers to step 278.

Reference number 281 encloses steps 268, 274, 276 and 280. The steps in reference number 281 are optional. Using a separate process for the singular case of a maximum block length of errors adds complexity. Processing time also increases for the majority of cases where the error length is not the maximum. If these optional steps 281 are omitted, control transfers directly to step 278 from steps 264 and 270, instead of to step 268.

In step 278 error correction is attempted using a modified Reed-Solomon decoder according to the principles of the present invention. Control continues in step 282 where if correction by the modified Reed-Solomon decoder is successful, control transfers to step 272; otherwise control transfers to step 284. In step 284 failure is signaled, indicating that uncorrected errors remain in the codeword.

Figures 8, 9:
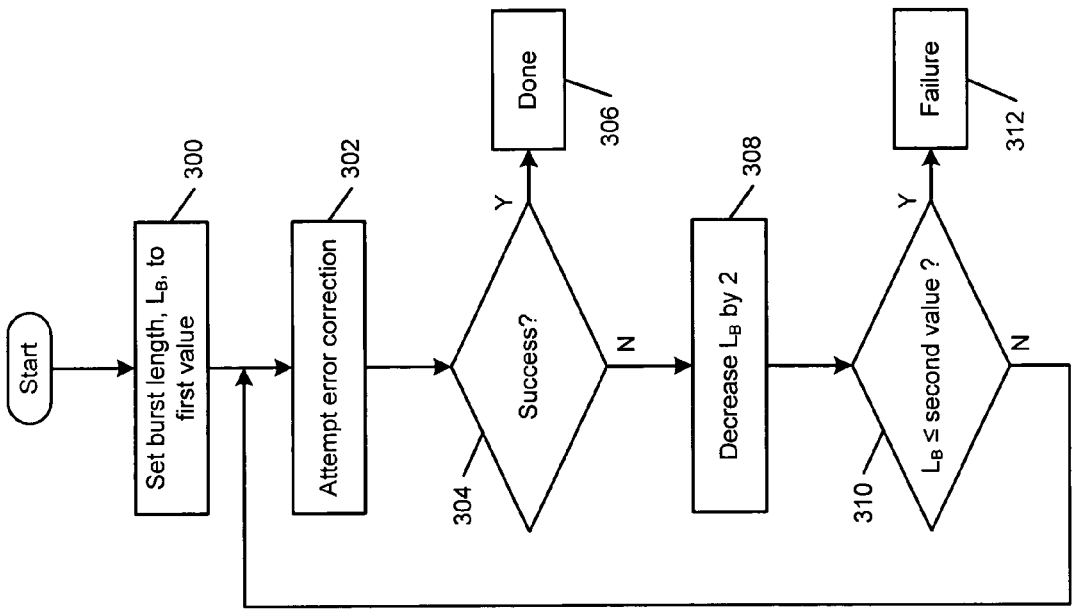
FIG. 8 is a table depicting the number of errors a RS decoder according to the principles of the present invention can correct for a code with t equal to 24.
FIG. 9 is a flow chart depicting exemplary steps taken by a decoding control module according to the principles of the present invention.

Referring now to FIG. 8, a table depicts the number of errors a Reed-Solomon (RS) decoder according to the principles of the present invention can correct for a code with t equal to 24. A first column 292 contains the maximum length of the error burst that the RS decoder can correct. A second column 294 contains the number of random errors the RS decoder can correct given the burst length in the first column 292. The third column 296 contains the total number of errors corrected, which is the sum of the error burst length 292 and the number of random errors 294.

Referring now to FIG. 9, a flow chart depicts exemplary steps taken by a decoding control module according to the principles of the present invention. Control begins in step 300 where the burst length $L_B$ is set to a first value. The first value may be the maximum value of $L_B$ to correct for the longest error burst possible. The greater the first value, the longer the algorithm will take on average, while the likelihood of correcting all errors increases. This maximum value is dependent upon t where 2t is equal to n–k, the number of ECC check symbols. The maximum value of $L_B$ is equal to 2t–3. If the error burst length is thought to be equal to 2t–1, the algorithm of Chen, "A Burst Error Correction Algorithm For Reed-Solomon Codes" can be applied to correct the error burst. Alternately, a RS encoder according to the principles of the present invention can be adapted for an $L_B$ equal to 2t, as demonstrated in FIG. 15.

Control transfers to step 302 where error correction as described below is attempted. Control continues in step 304 where if the error correction was successful, control transfers to step 306; otherwise control transfers to step 308. In step 306, error correction has been successful, and so control ends. In step 308 $L_B$ is decreased by 2 and control continues with step 310. In step 310, if $L_B$ is less than or equal to a second value, control transfers to step 312 where failure is reported; otherwise control returns to step 302. The second value may be as small as 2. As FIG. 8 demonstrates, a modified RS decoder with t equal to 24 can correct 25 errors when $L_B$ equals three. Because 25 is greater than t, there are some situations where varying $L_B$ down to three will allow the correction of otherwise uncorrectable errors. Traversing a wide range of $L_B$, however, is time-intensive to complete, an especial problem for real-time applications.

Figure 10:
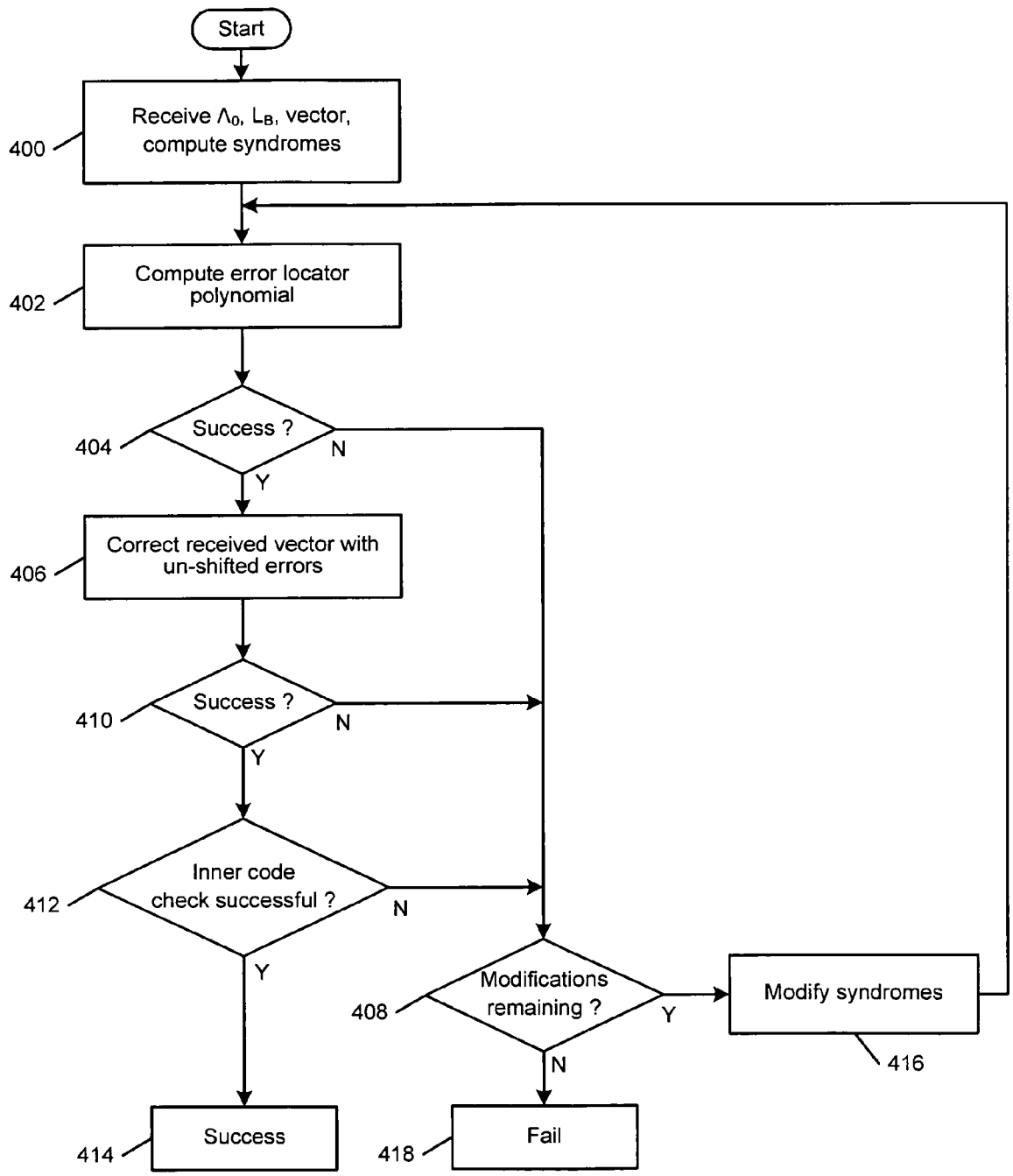
FIG. 10 is a flow chart depicting steps taken by an exemplary RS decoder according to the principles of the present invention.

Referring now to FIG. 10, a flow chart depicts steps taken by an exemplary Reed-Solomon decoder according to the principles of the present invention. Control begins in step 400 where control receives the information $\Lambda_0$ and $L_B$, and control computes syndromes for a received vector. $L_B$ is the maximum burst length of a burst of errors and $\Lambda_0$ is a precomputed polynomial initialized to indicate a burst of errors of length $L_B$ at the beginning of the codeword. The task of the decoder is then to determine, starting with this burst of errors, what additional positions within the codeword contain random errors. If the assumption that the burst of errors occurred at the beginning of the codeword proves false, syndromes are modified. This essentially shifts the assumed location of the error burst one position over within the codeword.

Once the error burst position has reached the end of the codeword, all possible locations of the error burst have been attempted. For a codeword having n symbols, there are n–$L_B$+1 positions for the error burst. After attempting correction with the error burst located at the beginning of the codeword, there remain n–$L_B$ possible error burst location modifications. If error correction failed for every position, error correction fails for this value of $L_B$. As indicated in FIGS. 8 and 9, this process may be repeated with a smaller value of $L_B$ that allows for the correction of more random errors.

Control continues in step 402 where an error locator polynomial is computed. Control continues in step 404 where if computation of the error locator polynomial was successful (often determined by calculating a discrepancy Δ), control continues in step 406; otherwise control transfers to step 408. In step 406 error locations are found from the computed error locator polynomial, and error values are calculated. If codeword syndromes have been modified, error locations are shifted back an equivalent distance and the codeword is corrected by subtracting these reverse-shifted errors.

Control continues in step 410 where if the correction process has been successful, control continues in step 412; otherwise control transfers to step 408. In step 412 an inner code check (such as a cyclic redundancy check) is performed. If this check is successful, control transfers to step 414; otherwise control transfers to step 408. In step 414 success is signaled because errors have been removed from the codeword and the inner code check is successful. The probability of any miscorrected errors going undetected by the inner code check is extremely small.

In step 408, if further syndrome modifications exist, control transfers to step 416; otherwise control transfers to step 418. In step 416 syndromes associated with the codeword are modified and control returns to step 402. The syndromes are modified such that the error burst of length $L_B$ is essentially moved one position over in the codeword. Once the error burst has been placed in every position within the codeword, no modifications remain. In step 418 none of the possible positions of the error burst have allowed all errors to be corrected in the codeword, and a fail signal is asserted.

Figure 11:
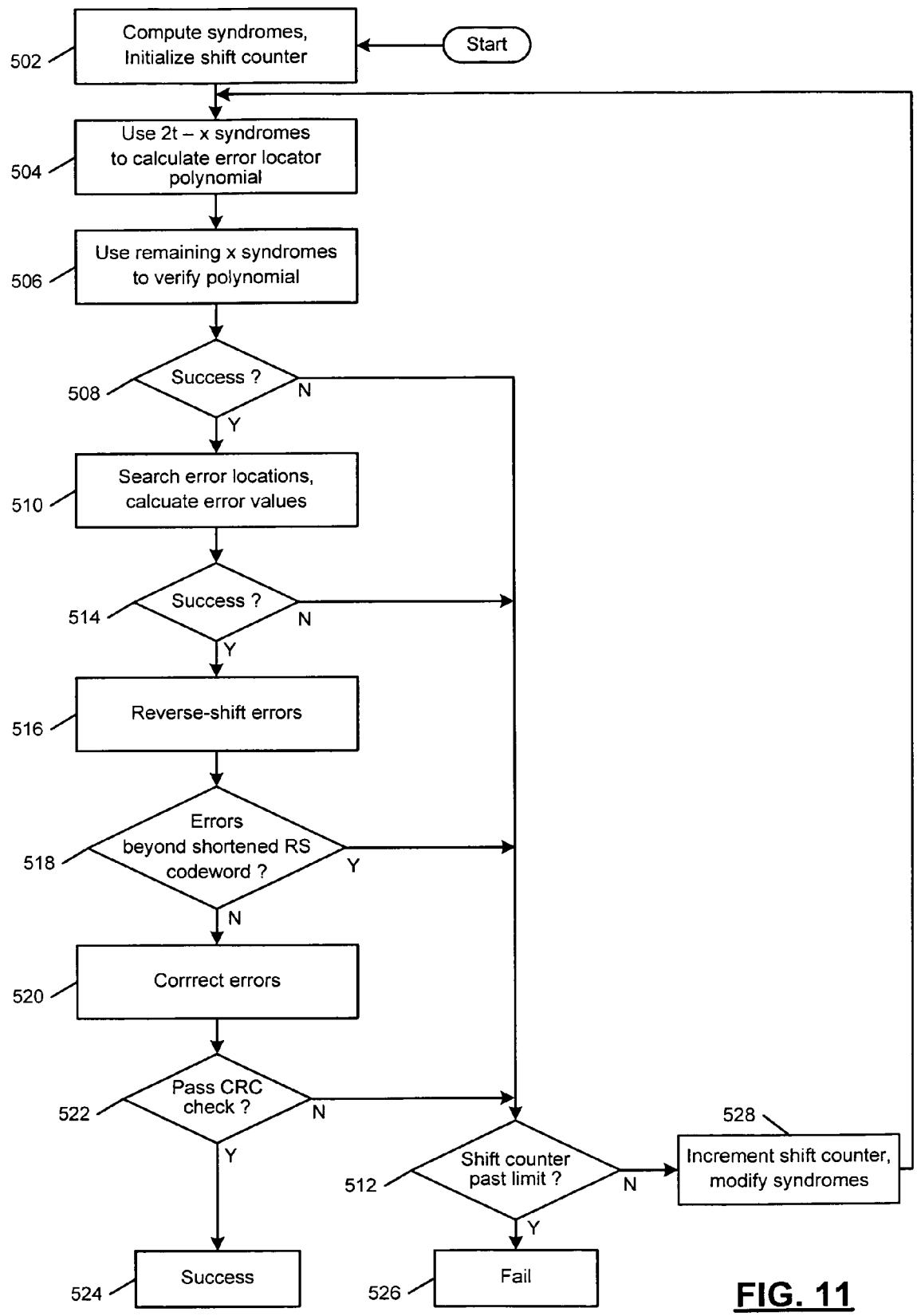
FIG. 11 is a flow chart depicting more detailed steps taken by an exemplary implementation of a modified RS decoder according to the principles of the present invention.

Referring now to FIG. 11, a flow chart depicts more detailed steps taken by an exemplary implementation of a modified Reed-Solomon decoder according to the principles of the present invention. Control begins in step 502 where syndromes are computed and a shift counter is initialized, possibly to zero. Control transfers to step 504, where 2t–x syndromes are used to calculate an error locator polynomial. Control transfers to step 506 where the remaining x syndromes are used to verify the error locator polynomial. If this verification is successful in step 508, control transfers to step 510; otherwise control transfers to step 512.

In step 510 roots of the error locator polynomial are searched for error locations and error values are calculated. An error location search can be performed by, for example, a Chien search, and error values can be calculated by, for example, the Forney algorithm. Control transfers to step 514 where if these processes are successful, control transfers to step 516; otherwise control transfers to step 512. In step 516 errors are reverse-shifted. If the shift counter is still zero, no action needs to be taken in this step. If the shift counter is nonzero, however, the syndromes have been modified. The calculated error locations are therefore shifted, and in order to apply error correction to the original unshifted codeword, the error locations should be shifted in reverse by the amount the syndromes had been modified.

Control then transfers to step 518 where if any of these reverse-shifted errors are beyond the end of the codeword (a problem that will ordinarily only arise when using a shortened RS code), control transfers to step 512; otherwise control transfers to step 520. In step 520 the codeword is corrected by subtracting error values at the error locations from the codeword. Control transfers to step 522 where an inner code check (for example a cyclic redundancy check) is performed. If successful, control transfers to step 524 where success is signaled; otherwise control transfers to step 512.

In step 512, if the shift counter is past a certain limit, control transfers to step 526; otherwise control transfers to step 528. The shift counter limit is set by the number of possible placements of the $L_B$ length error burst in the codeword. Once the error burst has been tried at all possible locations without successfully correcting all errors, failure is indicated in step 526. In step 528 the shift counter is incremented and the syndromes are modified. Control then returns to step 504.

Figure 12:
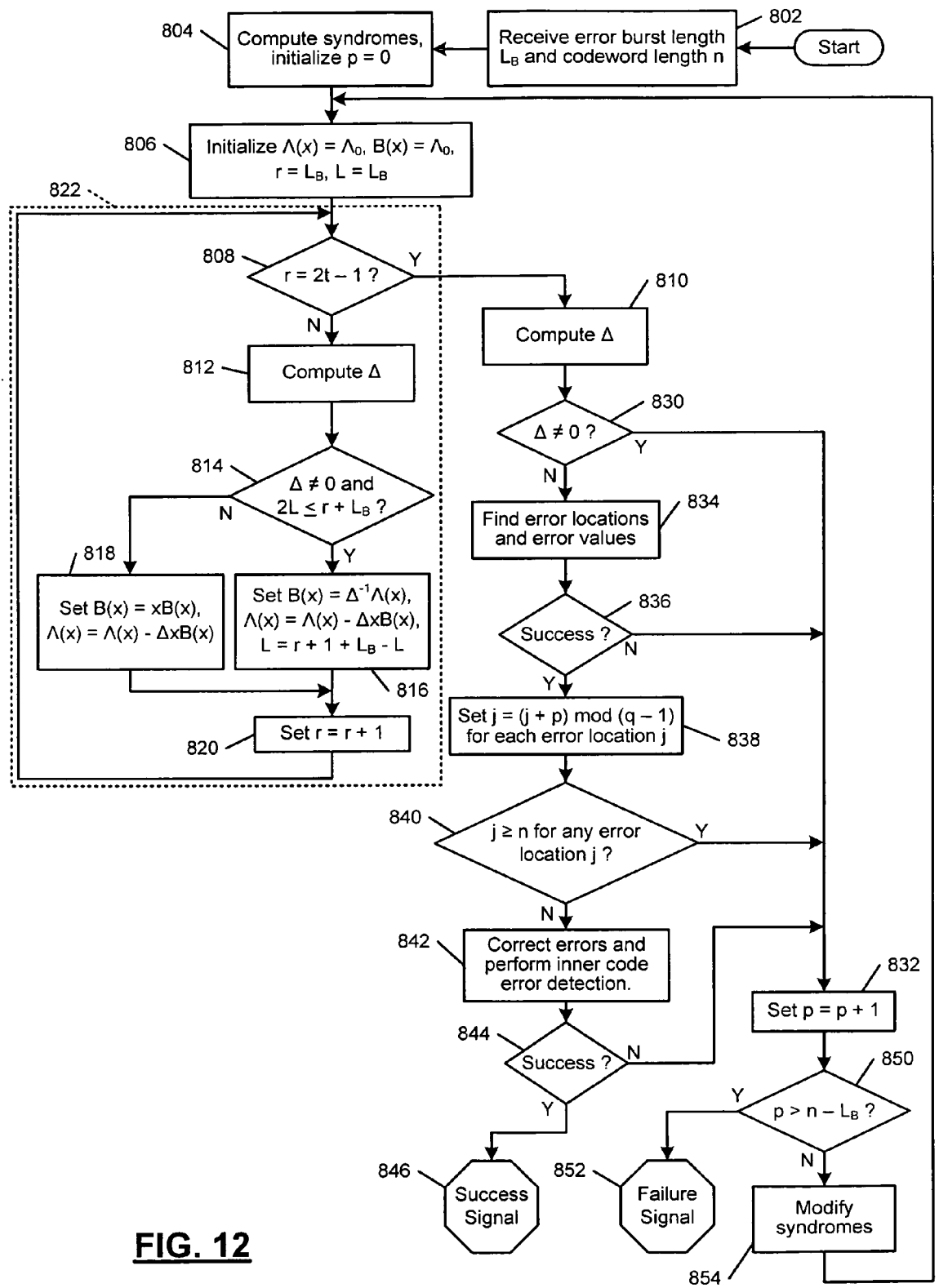
FIG. 12 is a flow chart depicting detailed steps taken by an exemplary modified RS decoder according to the principles of the present invention.

Referring now to FIG. 12, a flow chart depicts detailed steps taken by an exemplary modified Reed-Solomon decoder according to the principles of the present invention. Control begins in step 802 where error burst length $L_B$ and codeword length n are received. Control transfers to step 804 where syndromes are computed and p is initialized to zero. Control transfers to step 806 where $\Lambda(x)$ is initialized to a pre-computed polynomial $\Lambda_0$, B(x) is initialized to $\Lambda_0$, r is set to $L_B$, and L is set to $L_B$. $\Lambda_0$ is dependent only upon burst error length $L_B$, according to $$\Lambda_0(x) = \sum_{i=0}^{L_B-1} (1 - \alpha^i x).$$

It may therefore be computed, among other times, at design time or upon power-up, for each anticipated value of $L_B$. These pre-computed polynomials may be stored in a coefficient table or any other suitable storage medium. A RS decoder according to the principles of the present invention could accommodate erasures, but then the initial polynomial $\Lambda(x)$ could not be pre-computed, a costly sacrifice.

Control transfers to step 808 where r is compared to 2t–1. If r is equal to 2t–1, control transfers to step 810; otherwise control transfers to step 812. In step 812 a discrepancy Δ is computed according to $$\Delta = \sum_{i=0}^{L} \Lambda_i S_{r-i}.$$

Figure 4:
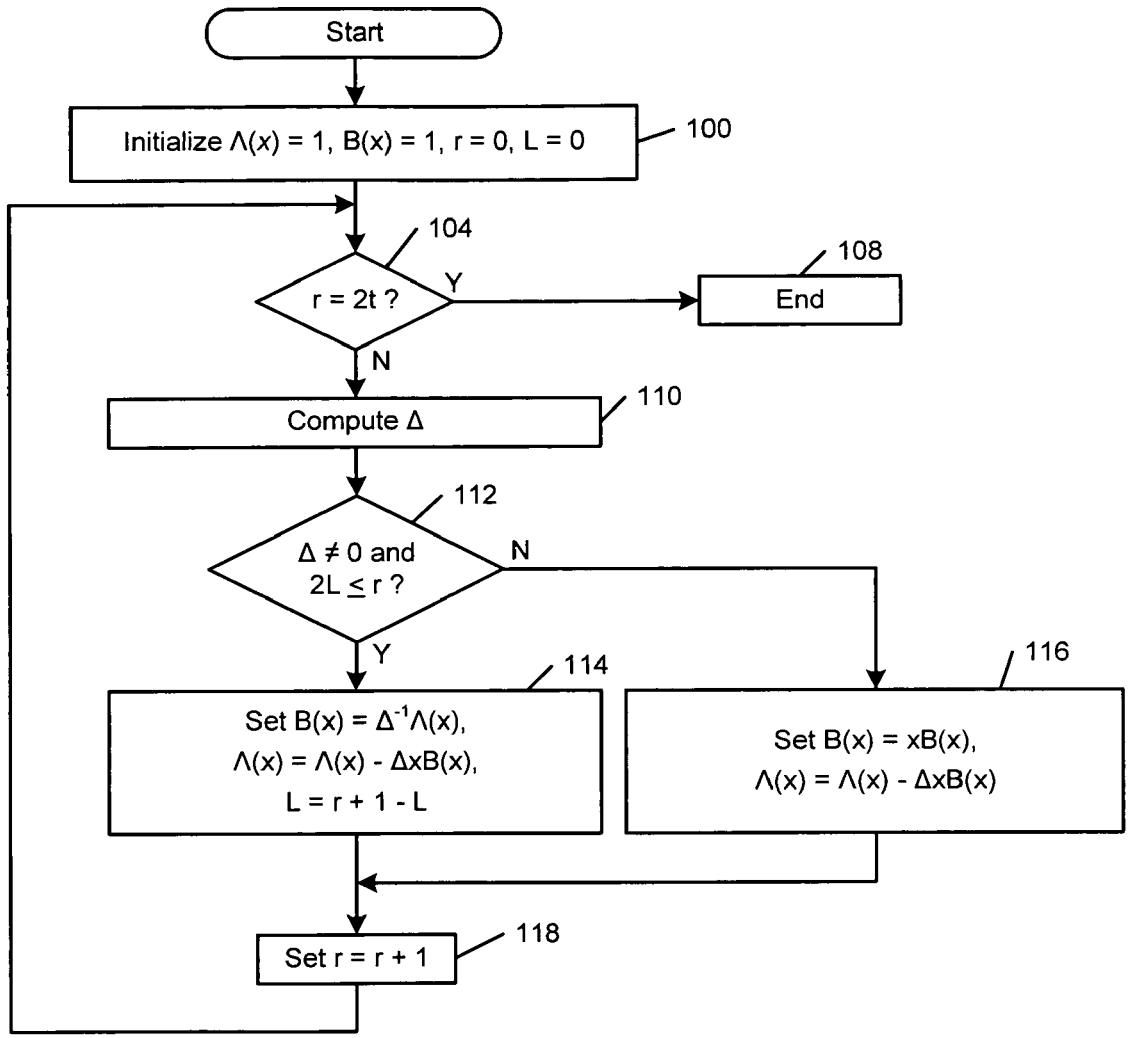
FIG. 4 illustrates steps of a BMA disclosed by Berlekamp for calculating an error locator polynomial according to the prior art.

Control transfers to step 814 where if Δ is not equal to zero and two times L is less than or equal to r+$L_B$, control transfers to step 816; otherwise control transfers to step 818. In step 816 B(x) is set to $\Delta^{-1}\Lambda(x)$, $\Lambda(x)$ is simultaneously set to $\Lambda(x)-\Delta x B(x)$, and L is set to r+1+$L_B$–L. Control continues in step 820. In step 818 B(x) is set to xB(x) and $\Lambda(x)$ is simultaneously set to $\Lambda(x)-\Delta x B(x)$. Control continues in step 820 where r is incremented by one, and control returns to step 808. Reference numeral 822 encloses steps 808, 812, 814, 816, and 820, and indicates a modified Berlekamp-Massey algorithm, as can be seen by comparison to FIG. 4.

In step 810 a discrepancy Δ is computed. Because r is equal to 2t–1, the equation becomes $$\Delta = \sum_{i=0}^{L} \Lambda_i S_{2t-1-i}.$$

Control continues in step 830 where if Δ is not equal to zero, control transfers to step 832; otherwise control transfers to step 834. In step 834 error locations and error values are determined using methods known to those skilled in the art. For instance, a Chien search of the error locator polynomial $\Lambda(x)$ will yield error locations, and Forney's algorithm will yield error values. Control continues in step 836 where if error locations and values were found successfully in step 834, control transfers to step 838; otherwise control transfers to step 832.

In step 838, for each error location j, j is set to (j–p)mod (q–1). Control transfers to step 840. If j is greater than or equal to n for any error location j, control transfers to step 832; otherwise control transfers to step 842. In step 842 the received codeword is corrected using the previously found error values and newly shifted error locations. The corrected codeword is passed to the inner code decoder, which performs error detection. Control continues in step 844 where, if the inner code check proved successful (no errors were miscorrected by the Reed-Solomon decoder), control transfers to step 846; otherwise control transfers to step 832.

In step 846 errors have been successfully corrected and control issues a success signal and stops, pending the next codeword being received. In step 832 p is set to p+1 and control continues in step 850. In step 850, if p is greater than n–$L_B$, control transfers to step 852; otherwise control transfers to step 854. In step 852 failure is signaled and control stops, pending the next received codeword. In step 854 syndromes are modified such that $S_j$ is set to $\alpha^{-j} S_j$ for each of the syndromes. Control then returns to step 806.

Figure 13:
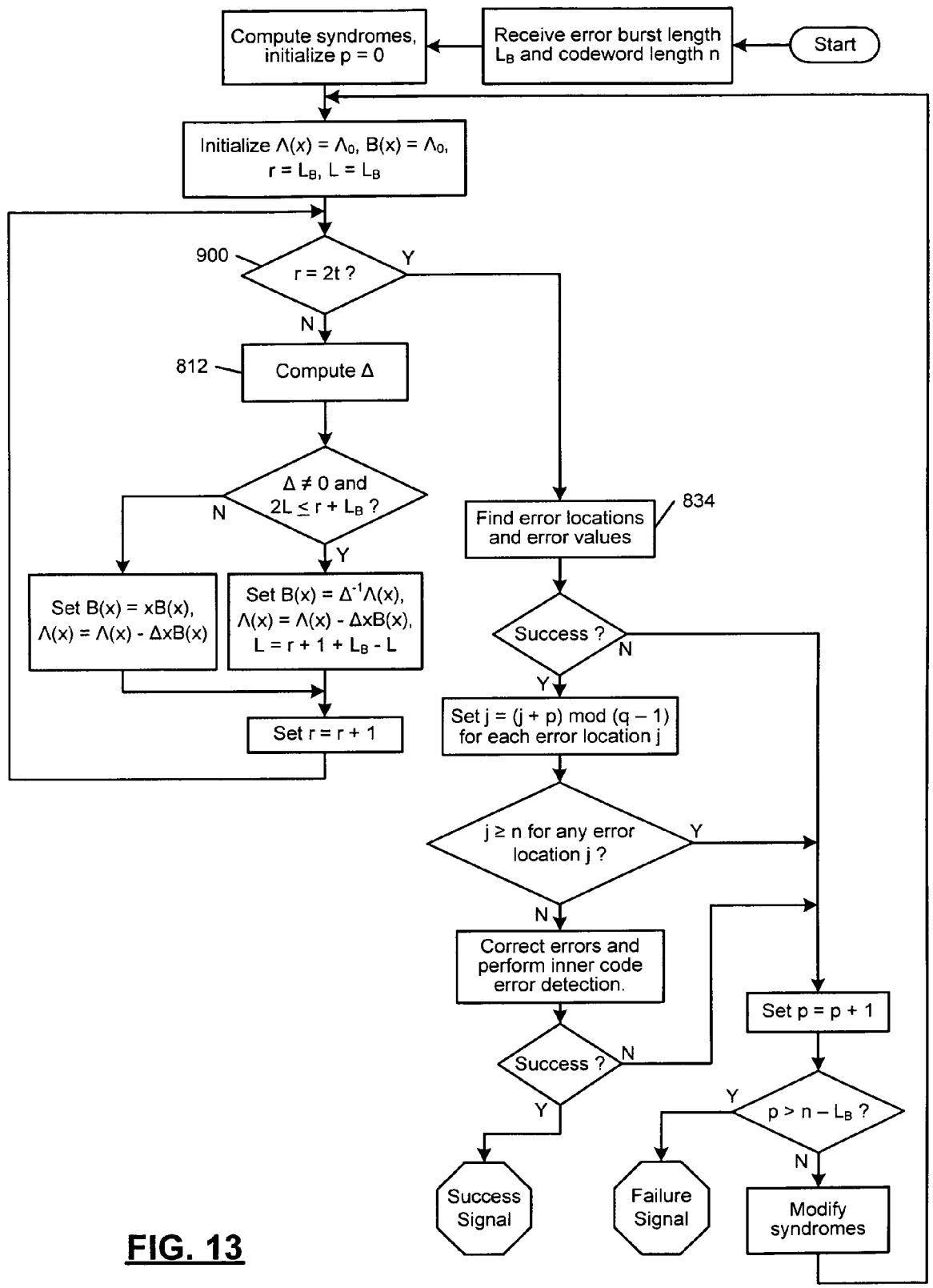
FIG. 13 is a flow chart depicting exemplary steps taken by a modified RS decoder for a case where no residual discrepancy is calculated.

Referring now to FIG. 13 a flow chart depicts exemplary steps taken by a modified Reed-Solomon decoder for a case where no residual discrepancy is calculated. The steps of FIG. 13 are similar to the steps of FIG. 12 excepting that step 900 of FIG. 13 is different from step 808 of FIG. 12, and steps 810 and 830 of FIG. 12 have been omitted. In step 900 r is compared to 2t, and if equal, control transfers to step 834; otherwise control transfers to step 812.

Comparing r to 2t means that all 2t syndromes will be used in calculating the error locator polynomial. This allows for the maximum number of random errors to be corrected. However, without calculating a residual discrepancy as occurs in step 810 of FIG. 12, invalid error locator polynomials that would have been quickly identified by a nonzero residual discrepancy are searched for error locations and error values. This is an expensive process in terms of both power consumption and time. In addition, the inner code check will likely be performed on the codeword corrected by these error locations and error values, even though calculating a residual discrepancy would have quickly invalidated the error locator polynomial.

Figure 14:
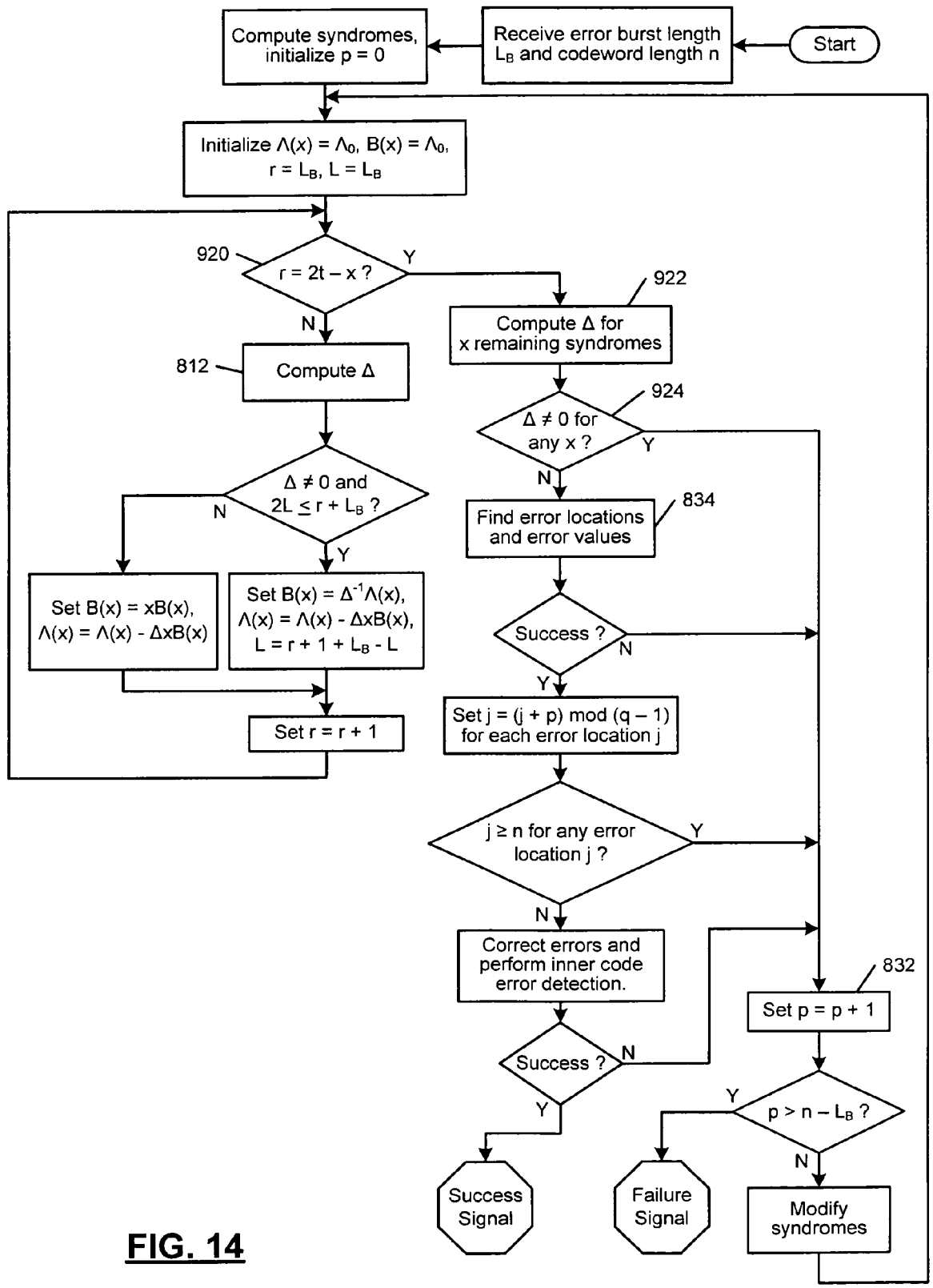
FIG. 14 is a flow chart depicting exemplary steps taken by a modified RS decoder according to the principles of the present invention for the case of using x syndromes to calculate residual discrepancies.

Referring now to FIG. 14, a flow chart depicts exemplary steps taken by a modified Reed-Solomon decoder according to the principles of the present invention for the case of using x syndromes to calculate residual discrepancies. The steps of FIG. 14 are similar to those of FIG. 12 excepting that steps 920, 922, and 924 of FIG. 14 are modified from steps 808, 810, and 830 of FIG. 12.

In step 920 r is compared to 2t−x. If equal, control transfers to step 922; otherwise control transfers to step 812. The number x signifies the number of reserved syndromes that are not used in calculating the error locating polynomial. This means that with a larger x, fewer random errors can be corrected. In step 922 a discrepancy Δ is calculated for each of the x remaining syndromes.

Control transfers to step 924 where if the discrepancy Δ for any of the x remaining syndromes is not equal to zero, control transfers to step 832; otherwise control transfers to step 834. Using x syndromes to calculate x discrepancies greatly increases the certainty that the error locator polynomial is valid.

Figure 15:
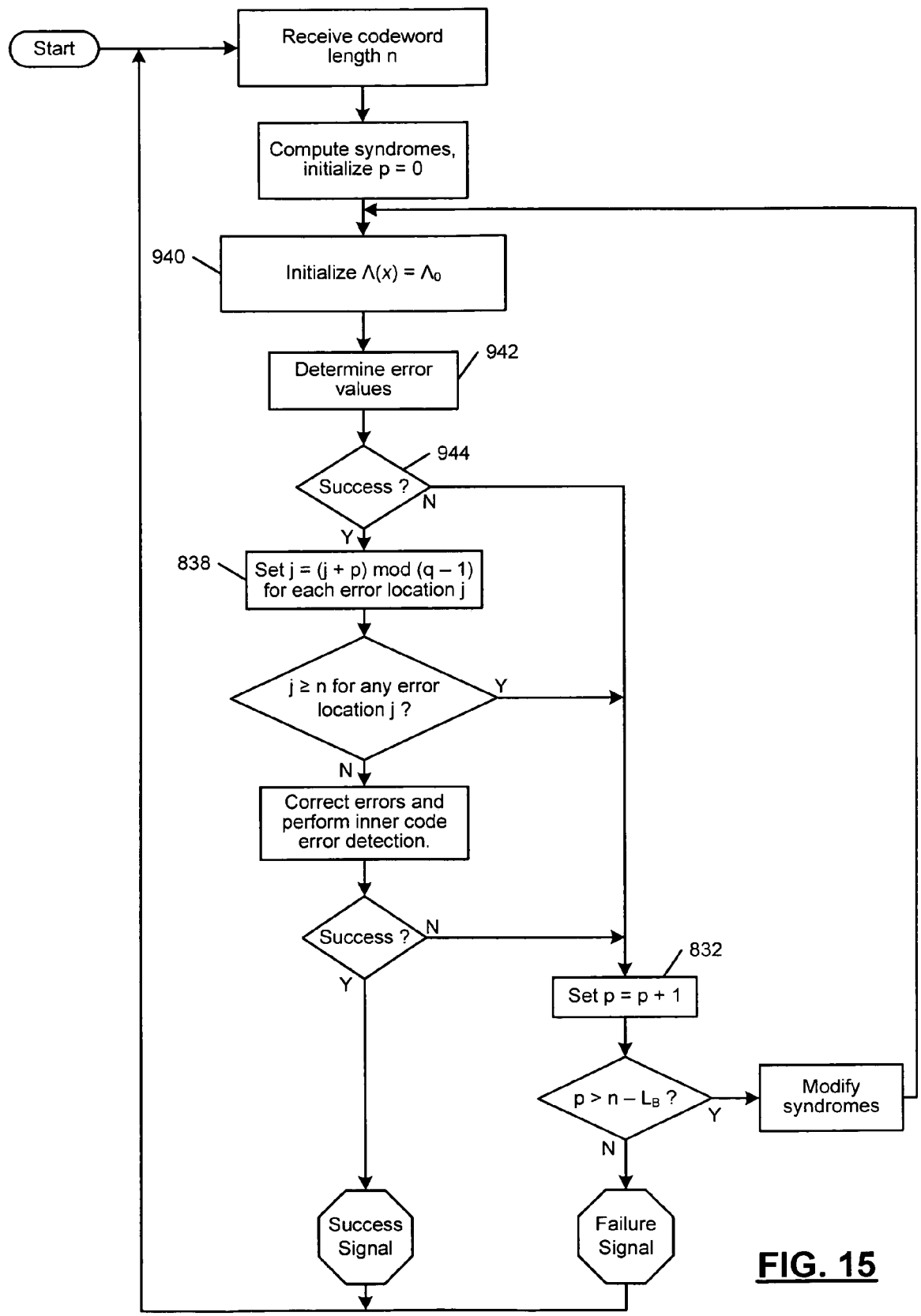
FIG. 15 is a flow chart depicting exemplary steps taken by a modified RS decoder according to the principles of the present invention for the case where $L_B$ is equal to 2t.

Referring now to FIG. 15, a flow chart depicts exemplary steps taken by a modified Reed-Solomon decoder according to the principles of the present invention for the case where $L_B$ is equal to 2t. The steps of FIG. 15 are similar to those of FIG. 12 excepting that step 940 of FIG. 15 is modified from step 806 of FIG. 12. Step 940 transfers directly to step 942, removing steps 808, 810, 812, 814, 816, 818, 820, 830, 834, and 836 of FIG. 12.

In step 940 Λ(x) is initialized to $\Lambda_0$. Control transfers to step 942 where error values are determined based on the error locator polynomial Λ(x). Control then transfers to step 944 where if error values are calculated successfully, control transfers to step 838; otherwise control transfers to step 832. The error locator polynomial does not need to be computed because no random errors are accounted for in this case. Only the precomputed polynomial, having one burst of errors of length $L_B$, can be corrected.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An error decoding system comprising:
a first Reed-Solomon (RS) decoder that receives an encoded codeword and generates a decoded codeword;
an inner code (IC) decoder that checks said decoded codeword for uncorrected errors; and
a decoding control module that communicates with said first RS decoder and said IC decoder, that iteratively modifies an error burst length of said first RS decoder if said IC decoder detects uncorrected errors in said decoded codeword, and that instructs said first RS decoder to decode said encoded codeword again after modifying said error burst length.

2. The error decoding system of claim 1 wherein said IC decoder includes at least one of a cyclic redundancy check module and a checksum computation module.

3. The error decoding system of claim 1 wherein said encoded codeword comprises a plurality of data symbols and C check symbols, and said first RS decoder is capable of correcting x random errors when 2x+n<C, where n is said error burst length.

4. The error decoding system of claim 1 wherein said decoding control module varies said error burst length over a range of values.

5. The error decoding system of claim 4 wherein said decoding control module varies said error burst length by multiples of two.

6. The error decoding system of claim 4 wherein said decoding control module repeatedly instructs said first RS decoder to decode said encoded codeword until the occurrence of at least one of said IC decoder detects no uncorrected errors in said decoded codeword and said decoding control module reaches an end of said range of values.

7. The error decoding system of claim 4 wherein said decoding control module varies said error burst length between a first value and a second value until said IC decoder detects no uncorrected errors.

8. The error decoding system of claim 7 wherein said first value is greater than said second value.

9. The error decoding system of claim 7 wherein said encoded codeword comprises a plurality of data symbols and C check symbols, and wherein said first value is less than or equal to C−3.

10. The error decoding system of claim 7 wherein said second value is greater than or equal to 3.

11. The error decoding system of claim 1 further comprising a second Reed-Solomon (RS) decoder that generates a second decoded codeword from said encoded codeword, wherein if said IC decoder detects no uncorrected errors in said second decoded codeword, said decoding control module instructs said first RS decoder to remain idle.

12. The error decoding system of claim 11 wherein said encoded codeword comprises a plurality of data symbols and 2t check symbols, and said second RS decoder is capable of correcting up to x errors and y erasures when 2x+y≦2t.

13. The error decoding system of claim 12 wherein said second RS decoder includes said first RS decoder operating in a specific operating mode.

14. A communications system comprising:
the error decoding system of claim 1;
an encoding system including an inner code (IC) encoder and a Reed-Solomon (RS) encoder, wherein said IC encoder receives user data, encodes said user data with error checking information into a first codeword, and transmits said first codeword to said RS encoder, and wherein said RS encoder generates an encoded codeword from said first codeword; and
a communications channel that receives said encoded codeword and transmits said encoded codeword to said error decoding system.

15. The communications system of claim 14 wherein said IC encoder appends a calculated value to said user data to form said first codeword.

16. The communications system of claim 15 wherein said IC decoder calculates a second value from said decoded codeword, and determines that said decoded codeword contains uncorrected errors if said second value is not equal to said appended calculated value.

17. An error decoding method comprising:
receiving an encoded codeword;
generating a decoded codeword using Reed-Solomon (RS) decoding;
checking said decoded codeword for uncorrected errors; and
iteratively modifying an error burst length of said RS decoding if uncorrected errors are detected in said decoded codeword.

18. The error decoding method of claim 17 wherein said checking said decoded codeword includes calculating at least one of a cyclic redundancy check and a checksum.

19. The error decoding method of claim 17 wherein said encoded codeword comprises a plurality of data symbols and C check symbols, and wherein said generating said decoded codeword includes correcting up to x random errors where $2x+n<C$, where n is said error burst length.

20. The error decoding method of claim 17 wherein said iteratively modifying said error burst length includes varying said error burst length over a range of values.

21. The error decoding method of claim 20 wherein said iteratively modifying said error burst length includes varying said error burst length by multiples of two.

22. The error decoding method of claim 20 further comprising repeating said generating said decoded codeword until the occurrence of at least one no uncorrected errors are detected in said decoded codeword and an end of said range of values is reached.

23. The error decoding method of claim 20 wherein said iteratively modifying said error burst length includes varying said error burst length from a first value through a second value until no uncorrected errors are detected.

24. The error decoding method of claim 23 wherein said first value is greater than said second value.

25. The error decoding method of claim 23 wherein said encoded codeword comprises a plurality of data symbols and C check symbols, and wherein said first value is less than or equal to $C-3$.

26. The error decoding method of claim 23 wherein said second value is greater than or equal to 3.

* * * * *